(12) United States Patent
Tong et al.

(10) Patent No.: US 6,298,464 B1
(45) Date of Patent: Oct. 2, 2001

(54) METHOD AND APPARATUS FOR MAXIMUM LIKELIHOOD SEQUENCE DETECTION

(75) Inventors: Mui-Chwee Tong, Singapore (SG); Nicholas Weiner, Bristol (GB)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/203,770

(22) Filed: Dec. 2, 1998

(30) Foreign Application Priority Data

Dec. 4, 1997 (SG) .................................................. 9704312

(51) Int. Cl.[7] .................................................. H03M 13/41
(52) U.S. Cl. ............................................................ 714/795
(58) Field of Search ................................................ 714/795

(56) References Cited

U.S. PATENT DOCUMENTS

| | | | |
|---|---|---|---|
| 4,614,933 | * | 9/1986 | Yamashita et al. ........... 340/347 DD |
| 5,430,744 | * | 7/1995 | Fettweis et al. ........................ 371/43 |
| 5,815,515 | * | 9/1998 | Dabiri ................................... 371/43.7 |
| 5,987,638 | * | 11/1999 | Yu et al. ................................ 714/795 |
| 6,070,263 | * | 5/2000 | Tsui et al. ............................. 714/795 |
| 6,148,431 | * | 11/2000 | Lee et al. .............................. 714/794 |

* cited by examiner

Primary Examiner—Stephen M. Baker

(57) ABSTRACT

In a Viterbi decoder, a branch metrics unit (51) receives samples and provides a branch metric to a first and second adder (54 and 55) that adds the branch metric to a first and second path metric from a path metrics memory (52). Concurrently, a comparator (56) compares the first and second path metrics and provides a select signal to a multiplexor (58) to select the output of the first or second adder (54 or 55). The selection signal is also provided to a path memory unit (33) which provides a detected symbol sequence. The output of the first or second adder (54 or 55) is selected by the multiplexor (58) and provided to the path metric memory (52) as an updated path metric.

6 Claims, 3 Drawing Sheets

METHOD AND APPARATUS FOR MAXIMUM LIKELIHOOD SEQUENCE DETECTION

FIELD OF THE INVENTION

This invention relates to maximum likelihood sequence detection and more particularly to maximum likelihood sequence detection in a Viterbi decoder.

BACKGROUND OF THE INVENTION

Viterbi decoders are well understood in the art. Such decoders function to reliably recover a data stream of symbols, which symbols can represent one or more bits of information. Viterbi decoders typically function to mathematically manipulate state and branch metrics in order to recover the most likely original symbols. Also typically, each iteration in the Viterbi calculation process will involve a number of addition steps, comparison steps, and selections steps, which addition, comparison, and selections steps are accomplished in a sequential process.

Fast Viterbi decoders typically comprise dedicated hardware platforms, as versus agile software programmable platforms, as the iterative Viterbi calculations can typically be effected more rapidly, at a reasonable cost, in a dedicated hardware platform. Because of the sequential nature of the addition, comparison, and selection steps, hardware solutions, while fast, are not always fast enough to suit all present needs with respect to speed of calculations.

BRIEF SUMMARY OF THE INVENTION

The present invention therefore seeks to provide a faster Viterbi decoder.

Accordingly, in one aspect the invention provides a method of maximum likelihood sequence detection comprising the steps of, during a single symbol period: combining a branch metric with each of a predetermined number of preselected path metrics to produce a corresponding number of resultant path metrics; comparing the predetermined number of preselected path metrics to identify one of the corresponding number of resultant path metrics; and selecting the one of the corresponding number of resultant path metrics.

In another aspect the invention provides a maximum likelihood sequence detector comprising: a first adder having an input coupled to receive a branch metric, another input coupled to receive a first path metric, and an output; a second adder having an input coupled to receive the branch metric, another input coupled to receive a second path metric, which second path metric is different from the first path metric, and an output; a comparator having a first input coupled to receive the first path metric, a second input coupled to receive the second path metric, and an output; and a multiplexor having data inputs coupled to the outputs of the first and second adder, a control input coupled to the output of the comparator, and an output.

BRIEF DESCRIPTION OF THE DRAWINGS

Embodiments of the invention will now be more fully described, by way of example, with reference to the drawings, of which.

DETAILED DESCRIPTION OF THE DRAWINGS

Viterbi detectors perform data detection using a recursive iterative algorithm. For binary data detection and a communication channel with memory m where one iteration is performed per symbol, each symbol overlaps with m adjacent symbols. A Viterbi detector for a binary communication channel with memory m has $2^m$ states. For each of these states, a state metric is the "cost" function for the most likely path leading to that state. The cost function is a measure of the probability that an original sequence of symbols matches the sequence of symbols associated with that state.

A branch metric is an incremental cost function associated with a path from one state to a possible next state. During each iteration, a set of state metrics is updated. To each state metric, two different branch metrics are added, yielding two path metrics. Pairs of path metrics are compared and one path metric is selected from each pair as a new state metric. These operations are often represented in a Viterbi Trellis diagram.

Figure 1:
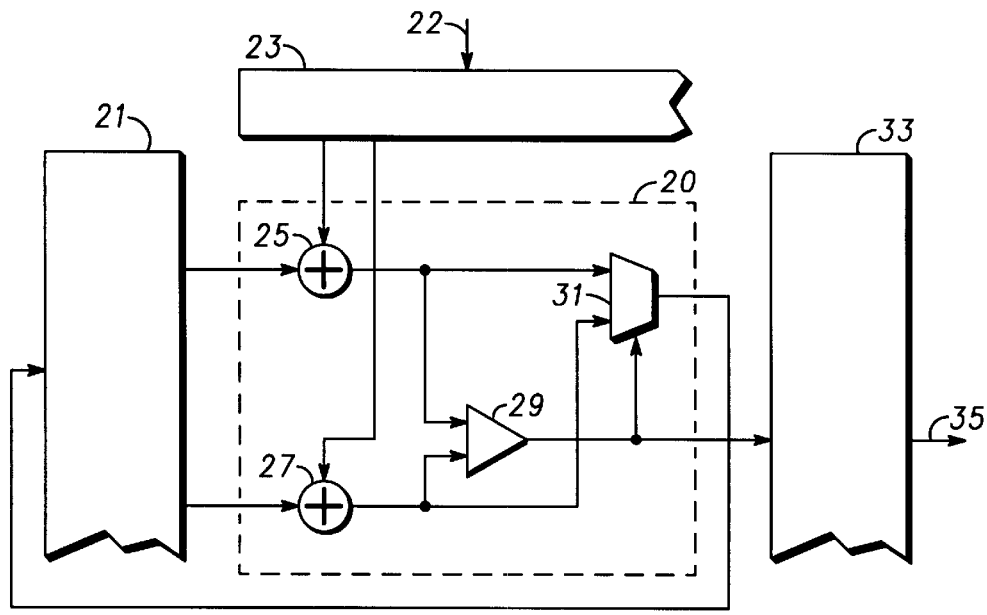
FIG. 1 shows a schematic diagram of a part of a Viterbi decoder in accordance with the prior art.

FIG. 1 shows a Viterbi trellis diagram for a binary data detector for a communication channel with memory m=2, and with four detector states indicated by 00, 01, 10 and 11, in binary. Branches from each detector state to each possible next state are annotated with symbols bk(i) for branch metrics and Pk(i) for path metrics, where i is the iteration number and k is the branch number. State metrics are annotated with symbols Sm(i), where m is the state number, and during each iteration the state metrics are updated.

In a hardware implementation of a high speed Viterbi Detector, the step of adding the state metric and the branch metric, and the steps of comparing and selecting the path metrics is performed by special purpose combinational logic circuits which are referred to as Add-Compare-Select (ACS) logic circuits.

Figure 2:
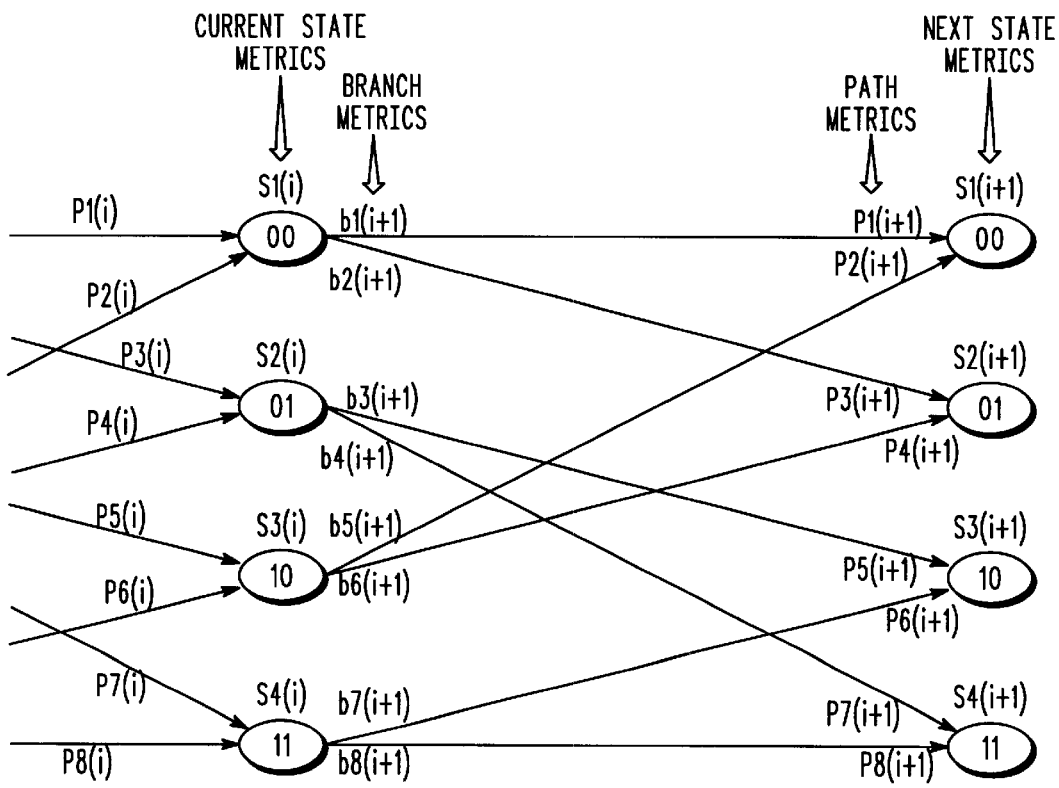
FIG. 2 shows a Viterbi trellis diagram for the Viterbi decoder a part of which is shown in FIG. 1.

In FIG. 2 a prior art ACS logic circuit 20 has: two inputs coupled to a branch metrics unit 23; two inputs and an output coupled to a state metrics memory unit 21; and an output coupled to a path memory unit 33. The branch metrics unit 23 has an input 22 that receives samples for decoding and provides two branch metrics to the ACS logic circuit 20. For hard disk drive data storage applications, typically each sample is a 6 bit data word, and rates of up to 400 million samples per second are used.

The state metrics memory unit 21 provides two state metrics to the ACS logic circuit 20 and receives an updated state metric from the ACS logic circuit 20. The path memory unit 33 receives a select signal from the ACS logic circuit 20 and has an output 35 that provides a detected symbol sequence.

The ACS logic circuit 20 includes a first adder 25 and a second adder 27 that are coupled to receive the inputs from the branch metrics unit 23 and the state metrics memory unit 21. The first adder 25 adds one of the inputs from the branch metrics unit 23 and one of the inputs from the state metrics memory unit 21 and provides a first adder output signal, while the second adder adds the other inputs from the branch metrics unit 23 and the state metrics memory unit 21 and provides a second adder output signal.

The first and second adder output signals are coupled to the inputs of a comparator 29 which provides a select signal indicating which of the first and second adder output signals represents the lowest cost, as defined by the cost function earlier. The first and second adder output signals are also coupled to inputs of a multiplexor 31. The select signal from the comparator 29 is coupled to a select input of the multiplexor 31 that selects either the first adder output signal or the second adder output signal, and the selected signal is provided from the output of the multiplexor 31. The select signal of the comparator 29 is also coupled to the path memory unit 33 for symbol detection.

The first and second adders 25 and 27, the comparator 29 and the multiplexor 31 operate sequentially. Thus, the operation of the first and second adders 25 and 27 must be completed before the comparator 29 receives the first and second adder output signals and can begin operation. Similarly, the multiplexor 31 has to wait for the comparator 29 to complete its operation before switching. Such sequential operation causes a delay between the time the branch and state metrics are provided to the first and second adders 25 and 27, up to the time output is available from the multiplexor 31. The time delay is the cumulative time of the sequential operations, and time delay of the ACS cell 20 determines the maximum frequency at which Viterbi iterations can be performed. For high frequency hard disk data storage applications, the time delay is a limiting factor in the performance of a hard disk drive that uses a Viterbi decoder with such an ACS cell.

The present invention advantageously performs steps of adding and comparing concurrently, thus increasing the speed of executing the Viterbi iterations.

In accordance with the present invention, for each state metric computation, 2 path metrics are computed and stored, and each iteration starts with 2 m path metrics and completes with the computation of 2m new path metrics.

Figure 3:
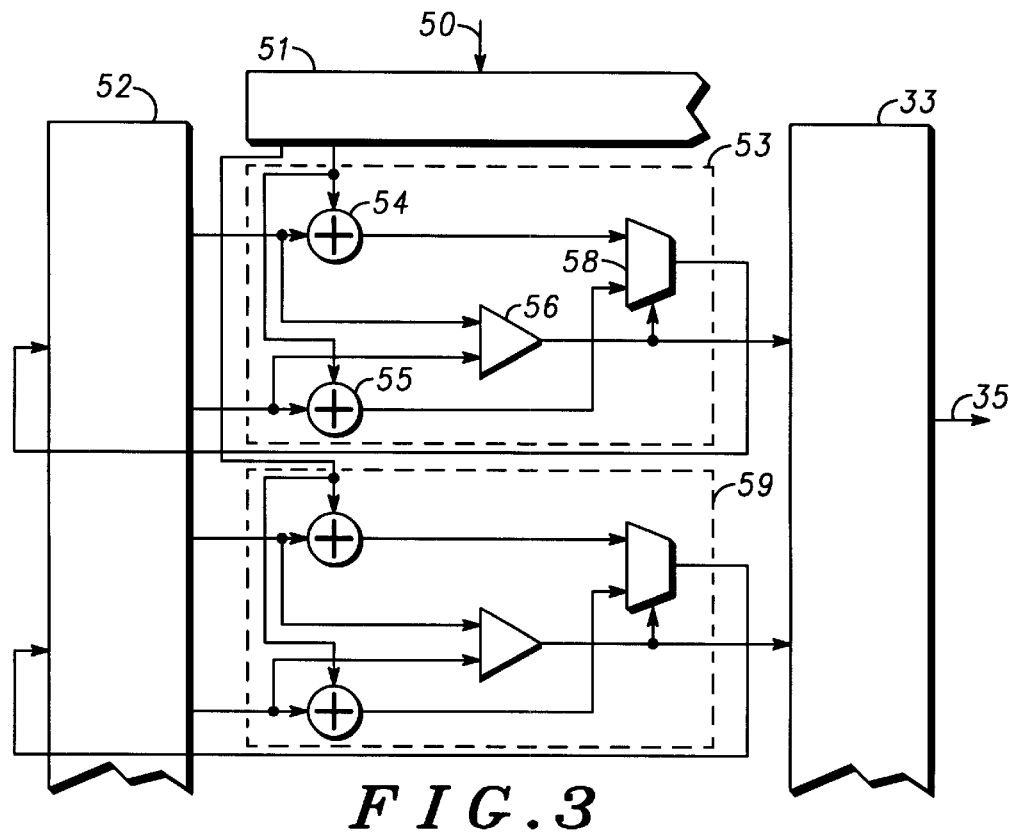
FIG. 3 shows a schematic diagram of a part of a Viterbi decoder in accordance with one embodiment of the present invention.
Figure 4:
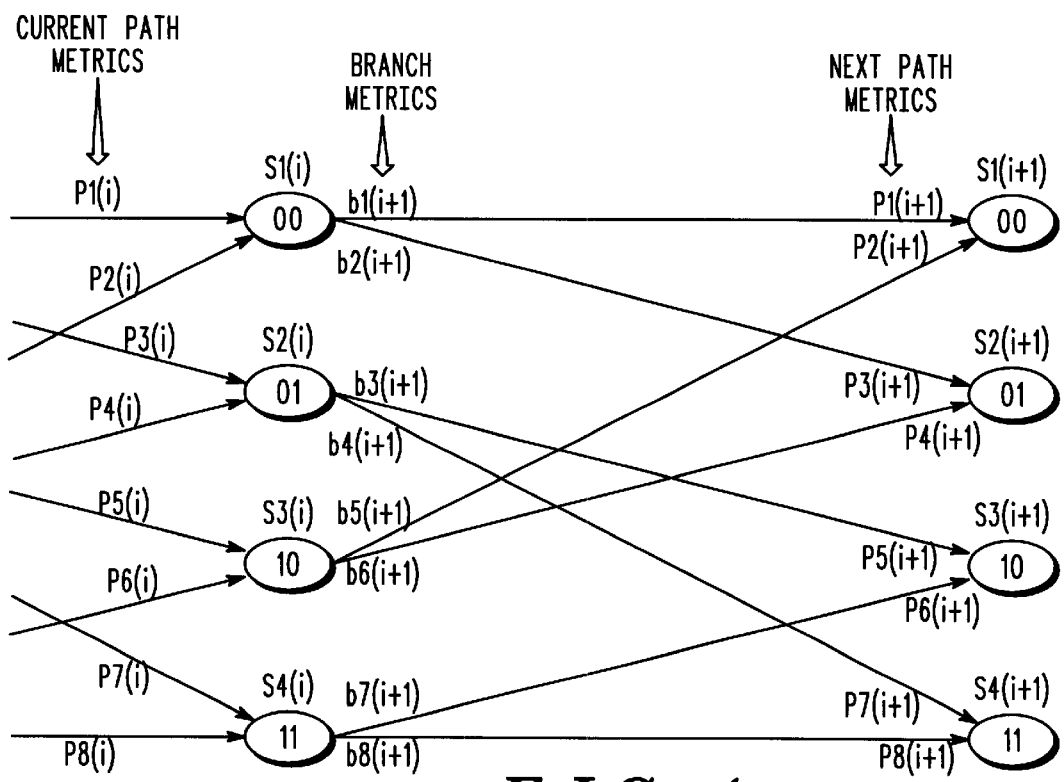
FIG. 4 shows a Viterbi trellis diagram for the Viterbi decoder a part of which is shown in FIG. 3.

FIG. 3 shows a part of a Viterbi detector in accordance with the present invention which includes a pair of identical logic circuits 53 and 59, each for processing one of the two path metrics. While only one of the logic circuits 53 is described in detail below, the same description applies to the other logic circuit 59 with the necessary changes.

The logic circuit 53 has: an input coupled to a branch metrics unit 51; two inputs coupled to a path metrics memory unit 52; an output coupled to a path memory unit 33; and an output coupled to the path metrics memory 52. The branch metrics unit 51 has an input 50 that receives input samples and provides a branch metric to the logic circuit 53. Path metrics are stored in the path metrics memory 52 which provides a first and second path metric to the logic circuit 53. Output from the logic circuit 53 is stored in the path memory unit 33. The path memory unit 33 also has an output 35 that provides a detected symbol sequence.

The logic circuit 53 includes a first adder 54, a second adder 55, a comparator 56 and a multiplexor 58. The first adder 54 is coupled to receive the first path metric and the branch metric and provides a first adder output signal, and the second adder 55 is coupled to receive the second path metric and the branch metric and provide a second adder output signal.

The comparator 56 is coupled to receive the first and second path metrics and provide a select signal indicating which of the two path metrics represents the lowest cost, as defined by the cost function earlier. The multiplexor 58 is coupled to receive the first and second adder output signals and has a select input that is coupled to receive the select signal from the comparator 56. The multiplexor 58 also has an output that provides either the first adder output signal or the second adder output signal in accordance with the select signal from the comparator 56. The select signal of the comparator 56 is also provided to the path memory unit 33, and the output of the multiplexor 58 is coupled to the path metrics memory 52.

During each iteration, the branch metric unit 51 provides a branch metric to both the first and second adders 54 and 55. It should be noted that the same branch metric is provided to both the first and second adders 54 and 55. In addition, the first and second adders 54 and 55 each receive a first and second path metric from the path metrics memory 52. The first and second adders 54 and 55 add the branch metric to the first and second branch metrics, respectively, and produce the first and second adder output signals.

In parallel with the adding step by the first and second adders 54 and 55, the first and second path metrics are compared by the comparator 56 which produces the select signal that indicates which of the first and second branch represents the lowest cost, as defined by the cost function earlier. The select signal of the comparator 56 causes the multiplexor 58 to select either the first or second adder output signal, and the selected adder output signal is provided to the path metrics memory 52 as an updated path metric. In addition, the select signal is also provided to the path memory unit 33.

In the present invention as described, a comparison is made between two path metrics with the same branch metric being added to each of the two path metrics. Consequently, the comparison step can be made independently of the addition step. This advantageously enables the comparison step and the addition step to be executed concurrently, leading to faster operation.

The addition step can be separated into two parts, with a first part where an addition step of less significant bits of the branch metric is executed in parallel with the comparison step, and a second part where an addition step of the more significant bits of the branch metric is executed after the selection step.

Figure 5:
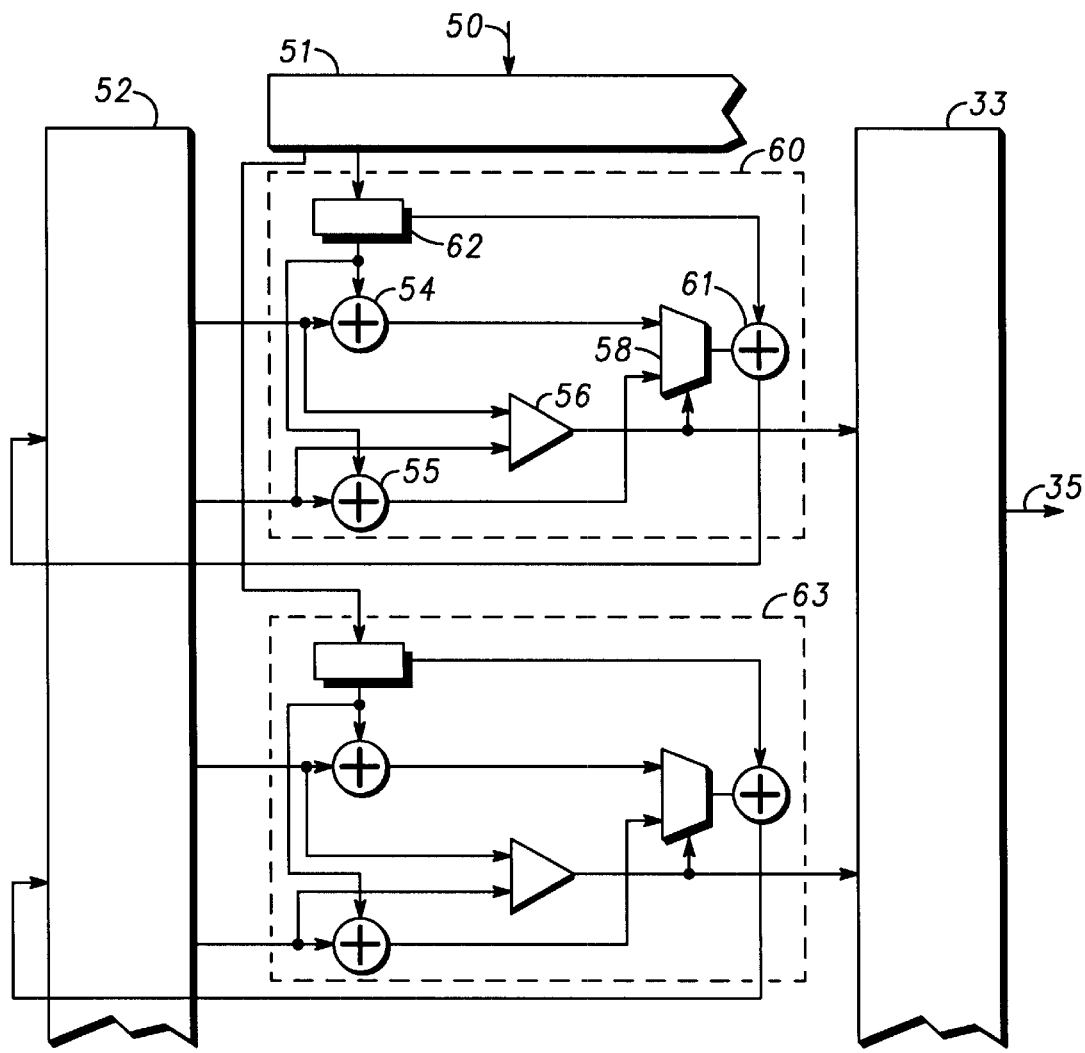
FIG. 5 shows a schematic diagram of a part of a Viterbi decoder in accordance with another embodiment of the present invention.

FIG. 5 shows a part of a Viterbi detector where two part addition of the branch metric is used. A pair of logic circuits 60 and 63 are coupled to the branch metrics unit 50, the path metrics memory 52 and the path memory 33, as before. As the two logic circuits 60 and 63 are identical, only one of the logic circuits 60 will be described, and the description applies equally to the other logic circuit 63 with the necessary changes.

The logic circuit 60 is similar to the logic circuit 53 described earlier, and in addition, includes a bit separator 62 and a third adder 61. The bit separator 62 receives a branch metric from the branch metric unit 50 and has a first output that provides less significant bits of the branch metric to the first and second adders 54 and 55, and a second output that provides the more significant bits of the branch metric to the third adder 61. The third adder 61 has a first input coupled to receive the more significant bits from the bit separator 62, and a second input coupled to the output of the multiplexor 58 to receive either the first or second adder output signal. The third adder 61 has an output that provides the sum of either the first or second adder output signal, and the more significant bits of the branch metric.

Judicious selection of the separation of the less and more significant bits of the branch metric allows the steps of addition/comparison and selection by the first and second adders 54 and 55, the comparator 56 and the multiplexor 58, and the subsequent step of adding the more significant bits by the third adder 61, to be performed in a shorter time than if the unseparated branch metric were used in the steps addition/comparison and selection only.

The speed of the comparator 56 is the limiting factor. Consequently, a selected separation of the less and more significant bits is optimised when the time taken by the first and second adders 54 and 55 to complete adding a selected number of less significant bits is equal to the time taken by the comparator 56 to complete comparison between the first and second path metrics.

The present invention advantageously performs steps of adding and comparing metrics concurrently. This is accomplished with a logic circuit having: a first and second adder for adding a branch metric to a first and second path metric; a comparator concurrently comparing the first and second path metrics; and a multiplexor that selects the output of the first or second adder in accordance with the output of the comparator.

The present invention therefore provides a faster Viterbi decoder.

What is claimed is:

1. A maximum likelihood sequence detector comprising:
    a bit separator means for receiving a branch metric and providing a first data word and a second data word;
    first adder means coupled to the bit separator means for receiving the first data word and a first path metric, and for providing a first adder output signal;
    a second adder means coupled to the bit separator means for receiving the first data word and a second path metric, which second path metric is different from the first path metric, and for providing a second adder output signal;
    a comparator means coupled to the first and second adder means for receiving the first path metric and the second path metric, and for providing a select signal;
    a multiplexor means coupled to the first adder means, the second adder means and the comparator means, for receiving the first and second adder output signals and having an output for providing a selected adder output signal in accordance with the select signal; and
    a third adder means coupled to the bit separator means and the multiplexor means for receiving the second data word and the selected adder output signal and for providing a third adder output signal.

2. A maximum likelihood sequence detector in accordance with claim 1 further comprising a path metrics memory means coupled to the third adder means and the first and second adder means for receiving the third adder output signal and providing the first and second path metrics.

3. A maximum likelihood sequence detector, comprising:
    a bit separator for receiving a branch metric and providing a first data word and a second data word;
    a first adder electrically connected to the bit separator for receiving the first data word and a first path metric, and for providing a first adder output signal;
    a second adder electrically connected to the bit separator for receiving the first data word and a second path metric different from the first path metric, and for providing a second adder output signal;
    a comparator for receiving the first and second path metrics and generating a select signal;
    a multiplexor electrically connected to the first adder, the second adder and the comparator, for receiving the first and second adder output signals and providing a selected adder output signal in accordance with the select signal; and
    a third adder electrically connected to the bit separator and the multiplexor for receiving the second data word and the selected adder output signal and providing a third adder output signal.

4. The maximum likelihood sequence detector of claim 3, further comprising a path metrics memory electrically connected to the first, second and third adders for receiving the third adder output signal and generating the first and second path metrics.

5. The maximum likelihood sequence detector of claim 4, further comprising a branch metric unit electrically connected to the bit separator for providing the branch metric thereto.

6. The maximum likelihood sequence detector of claim 5, further comprising:
    a path metrics memory electrically connected to the first, second and third adders for receiving the third adder output signal and generating the first and second path metrics; and
    a branch metric unit electrically connected to the bit separator for providing the branch metric thereto.

* * * * *